United States Patent

Miyata et al.

[15] 3,639,858

[45] Feb. 1, 1972

[54] TRANSISTOR IMPEDANCE CONVERTER AND OSCILLATOR CIRCUITS

[72] Inventors: Takeo Miyata, Atsugi-chi; Tsutomu Miura, Kawasaki-shi, both of Japan

[73] Assignee: Mitsumi Electric Company Ltd., Tokyo, Japan

[22] Filed: Aug. 26, 1969

[21] Appl. No.: 853,053

[30] Foreign Application Priority Data

Aug. 31, 1968 Japan....................................43/62241
Aug. 31, 1968 Japan....................................43/62242
Aug. 31, 1968 Japan....................................43/62243

[52] U.S. Cl.........................331/108 R, 331/115, 331/117 R, 333/80 T

[51] Int. Cl.........................................H03b 5/12, H03b 7/06

[58] Field of Search..........................331/108 R, 115, 117 R; 333/80 R, 80 T

[56] References Cited

UNITED STATES PATENTS

| | | | |
|---|---|---|---|
| 2,864,062 | 12/1958 | Schaffner | 331/115 X |
| 2,904,758 | 9/1959 | Miranda et al. | 333/80 T |
| 3,144,620 | 8/1964 | Raillard | 331/115 X |
| 3,153,205 | 10/1964 | Jones et al. | 331/115 |
| 3,167,724 | 1/1965 | Vallese | 331/115 X |
| 3,384,844 | 5/1968 | Meacham | 333/80 |

OTHER PUBLICATIONS

Pasupathy, " A Transistor RC Oscillator Using Negative Impedances," Electronic Engineering, December 1966, pp. 808, 809.

*Primary Examiner*—Roy Lake
*Assistant Examiner*—Siegfried H. Grimm
*Attorney*—Hill, Sherman, Meroni, Gross & Simpson

[57] ABSTRACT

An impedance device adapted to represent various types of impedance which includes a two-transistor circuit equivalent to a single transistor with a common base current amplification factor greater than one and a predetermined impedance element or circuit, and circuits using such an impedance device. This impedance device represents an impedance corresponding to the impedance of the impedance element or circuit multiplied by $-(\alpha_0-1)$ where $\alpha_0$ is the equivalent common base current amplification factor of the equivalent single-transistor circuit. One of the circuits using the impedance device is an oscillator which is constructed without an inductance element. Another of the circuits is an inductor having a pure inductance and which is constructed without using any inductance element.

8 Claims, 11 Drawing Figures

INVENTORS
Takeo Miyata
Tsutomu Miura
BY Hill, Sherman, Meroni, Gross & Simpson ATTORNEY INVENTORS
Takeo Miyata
Tsutomu Miura BY Hill, Sherman, Meroni, Gross & Simpson
ATTORNEY

TRANSISTOR IMPEDANCE CONVERTER AND OSCILLATOR CIRCUITS

FIELD OF THE INVENTION

This invention relates to an impedance device comprising a transistor circuit equivalent to a single grounded-base transistor with a current amplification factor greater than 1, and a circuit using such an device. More particularly, the present invention comprises an impedance device comprising a two-transistor circuit equivalent to a single grounded-base transistor with a current amplification factor greater than 1 (unity). The circuit formed of two complementary transistors of opposite conductivity types or the equivalent of two transistors of opposite conductivity types.

SUMMARY OF THE INVENTION

It is an object of the present invention to provide a novel impedance device including a two-transistor circuit equivalent to a single transistor with a current amplification factor ($\alpha$) greater than 1.

Another object of the present invention is to provide a novel oscillator circuit comprising a novel impedance device including a two-transistor circuit equivalent to a single transistor with a current amplification factor ($\alpha$) greater than 1 and containing at least one resistor.

Still another object of the present invention is to provide a novel inductance circuit constructed of a novel impedance device including a two-transistor circuit equivalent to a single transistor with a current amplification factor ($\alpha$) greater than 1, and including a resistor and a capacitor but without using any inductance element.

Other objects, features and advantages of the present invention will become apparent from the following description taken in conjunction with the accompanying drawings.

DESCRIPTION OF THE PREFERRED EMBODIMENTS

Figure 1:
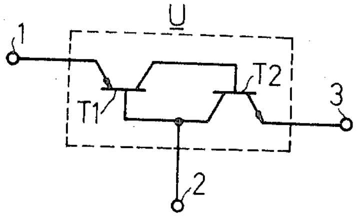
FIG. 1 is a connection diagram showing an example of the circuit which can be utilized in the present invention.

Referring to FIG. 1 of the drawings, U generally represents a two-transistor circuit equivalent to a single transistor which can be utilized in the present invention. An example of such circuit comprises a first PNP-transistor T1 and a second NPN-transistor T2, with the collector of the first transistor T1 connected to the base of the second transistor T2. Terminals 1 and 3 are connected to the emitters of the first and second transistors T1 and T2, respectively. The base of the first transistor T1 is connected to the collector of the second transistor T2, and a common terminal 2 is led out of the connection point between the base of the first transistor T1 and the collector of the second transistor T2.

Figure 2A:
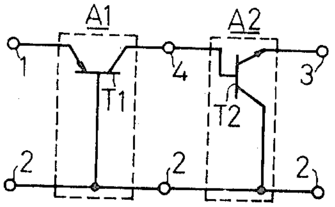
FIGS. 2A, 2B and 2C are circuit diagrams showing the equivalent circuits of the two-transistor circuit shown in FIG. 1, respectively.
Figure 4:
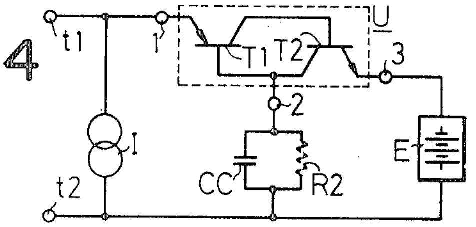
FIG. 4 is a connection diagram showing an example of the transistor impedance converter according to an embodiment of the present invention.

The equivalent single transistor circuit of the invention has the foregoing arrangement. Such a circuit as shown in FIG. 4 may be considered as constructed by a grounded-base transistor circuit A1 in cascade and having a pair of input terminals corresponding to the terminals 1 and 2 connected to the first transistor T1 and having a pair of output terminals corresponding to terminals 4 and 2. Terminal 4 connects to the connection point between the collector of the first transistor T1 and the base of the transistor T2. A grounded-collector transistor circuit A2 has a pair of input terminals corresponding to the terminals 4 and 2 fed out of the second transistor T2. A pair of output terminals 3 and 2, respectively, are connected to the emitter and collector of transistor T2 as shown in FIG. 2A.

Figure 2B:
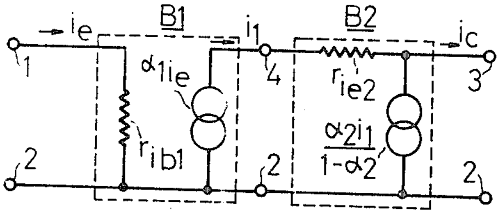

The grounded-base transistor circuit A1 may be represented as shown in FIG. 2B as an equivalent circuit in which the common base input impedance $r_{ib1}$ of the transistor T1 is connected between the terminals 1 and 2. A current source $\alpha_1 i_e$ is connected between the terminals 4 and 2 as shown by a symbol B1 in FIG. 2B, where $i_e$ and $i_1$ are the currents caused to flow through the terminals 1 and 4 respectively by a reverse bias voltage between the base and the collector of the transistor T1 and a forward bias current between the base and the emitter, and $\alpha_1$ is the common base current amplification factor of the transistor T1.

The grounded-collector transistor circuit A2 may be represented by an equivalent circuit comprising a series circuit of the common collector emitter impedance $r_{ie2}$ of the transistor T2. A current source $$\frac{\alpha_2 i_1}{1-\alpha_2}$$

is connected between the terminals 4 and 2 and the current source $$\frac{\alpha_2 i_1}{1-\alpha_2}$$

is connected between the terminals 3 and 2 as shown by B2 in FIG. 2B, where $\alpha_2$ is the common base current amplification factor of the transistor T2. A reverse bias voltage and forward bias current are imparted between the base and the collector of the transistor T2 and between the base and the emitter, respectively.

In the equivalent circuit of FIG. 2B, the impedance is infinite as viewed from the terminals 4 and 2 toward the circuit B1, and therefore the impedance as viewed from the terminals 3 and 2 toward the circuit B2 side may also be considered infinite. Hence, the impedance $r_{ie2}$ between the terminals 4 and 3 may be neglected. Thus, the current $i_c$ appearing at the terminal 3 is $$i_c = i_1 + \frac{\alpha_2 i_1}{1-\alpha_2} \quad (1)$$

Since the following relationship holds true $$i_1 = \alpha_1 i_e \quad (2)$$

by substituting equation (2) for equation (1) and rearranging the latter, the following expression is obtained:

$$\frac{i_c}{i_e} = \frac{\alpha_1}{1-\alpha_2} \quad (3)$$

Figure 2C:
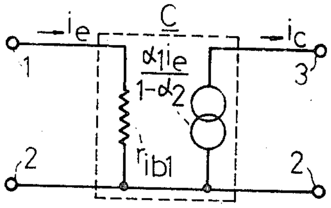

Thus, the equivalent circuit of FIG. 2B may be simplified as shown by C in FIG. 2C, wherein the common base input base impedance $r_{ib1}$ of the transistor T1 is connected between the terminals 1 and 2 and the current source $$\frac{\alpha_1 i_e}{1-\alpha_2}$$

is connected between the terminals 3 and 2. It will be seen that the terminal 1 of the equivalent single-transistor circuit shown in FIG. 1 corresponds to the emitter terminal of an ordinary transistor, the terminal 2 of to the base terminal, and the terminal 3 to the collector terminal. Therefore, the terminals 1, 2 and 3 may be referred to as the equivalent emitter, base and collector terminals, respectively. Assuming that $i_c/i_e$ in equation (3) is $\alpha_0$, the following equation is obtained:

$$\alpha_0=\alpha 1/1\ \alpha 2 \quad (4)$$

This is the equivalent common base current amplification factor, and $r_{ib1}$ is the equivalent common base input impedance.

In the present invention, the sum of the common base current amplification factor $\alpha_1$ of the transistor T1 and $\alpha_2$ of the transistor T2 is selected to be greater than 1. This is, the following relationship is established:

$$\alpha_1+\alpha_2>1 \quad (5)$$

Thus, the equivalent common base current amplification factor $\alpha_0$ represented by equation (4) is always greater than 1

As will be appreciated from the foregoing, the two transistor circuits equivalent to a single transistor circuit U shown in FIG. 1 has a common base current amplification factor greater than 1. In practice, $\alpha_o$ is about 100 in the case where 2SA355- and 2SC283-type transistors are employed.

Figure 3:
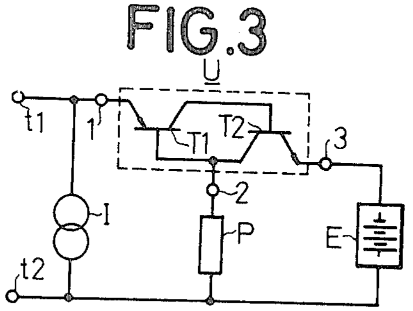
FIG. 3 is a connection diagram showing the principle of the transistor impedance converter.

In FIG. 3 the circuit U described above is used to construct an impedance device. A first terminal *t*1 is led out of the emitter terminal 1 of the circuit U, a second terminal *t*2 is led out the equivalent base terminal 2 through an impedance element or circuit P. A bias current source I is connected between the equivalent base terminal 2 and the equivalent emitter terminal 1 of the circuit U through the impedance circuit P. A bias voltage source E is connected between the equivalent collector terminal 3 and the equivalent base terminal 2 of the circuit U through the impedance circuit P.

By connecting the negative electrode of the voltage source E to the terminal 3 of the circuit U, a current from the current source I flows toward the terminal 1 of the circuit U. By suitably adjusting the voltage and current available from the voltage source E and current source I, a reverse bias voltage is applied between the base and the collector of the transistor T1 through the base emitter of the transistor T2 and impedance circuit P. A reverse bias voltage is similarly applied between the base and the collector of the transistor T2 through the emitter thereof and impedance circuit P. A forward bias current is supplied between the emitter and the base of the transistor T1 through the impedance circuit P, and a forward bias current is similarly supplied between the base and the emitter of the transistor T2 through the emitter-collector of the transistor T1 and voltage source E. Thus, the circuit U operates with an equivalent common base current amplification factor $\alpha_0$ greater than 1.

As a result, a desired impedance is obtained between the terminals *t*1 and *t*2.

This impedance will be considered below. Assume that the impedance of the impedance circuit P is $Z_1$. Since the impedance between the terminals 1 and 2 of the circuit U is $r_{ib1}$ as described above in connection with FIG. 2C, the impedance $Z_2$ as viewed from between the terminals *t*1 and *t*2 is $$Z_2=(1-\alpha_0)Z_1+r_{ib1} \quad (6)$$

Since $\alpha_0>1$ in the present impedance device, the factor $(1-\alpha_0)$ associated with $Z_1$ becomes negative and therefore $$Z_2=-(\alpha_0-1)Z_1+r_{ib1} \quad (7)$$

By establishing the following relationship $$|(\alpha_0-1)Z_1|>>|r_{ib1}| \quad (8)$$

the impedance $Z_2$ becomes:

$$Z_2=-(\alpha_0-1)Z_1 \quad (9)$$

It is seen that the impedance device according to the present invention represents an impedance corresponding to the sum of the equivalent common base input impedance $r_{ib1}$ of the circuit U and the impedance $Z_1$ of the impedance circuit P with a negative factor of $-(\alpha_0-1)$, as shown by equation (7).

Furthermore, with the impedance device of the present invention, it is possible to obtain an impedance corresponding to the impedance $Z_1$ of the impedance circuit P multiplied by the negative factor of $-(\alpha_0-1)$ by satisfying equation (8), as represented by equation (9).

It is to be particularly noted that the resent impedance device represents the impedance corresponding to the impedance $Z_1$ of the impedance circuit P multiplied by the negative factor of $-(\alpha_0-1)$ as shown in equation (9). That is, although the impedance of the impedance circuit P is $Z_1$, the impedance of the present impedance device becomes equal to $Z_1$ multiplied by the negative factor of $-(\alpha_0-1)$. This means that provision is made for converting the impedance of the impedance circuit P to a negative one. Thus, in accordance with the present invention, there is provided an impedance device which is adapted to produce a negative impedance corresponding to the impedance of the known impedance circuit P multiplied by the known factor of $-(\alpha_0-1)$.

Various embodiments of the present invention based on the principle of the impedance device of the invention, will be described with reference to FIGS. 4 and 5.

FIG. 4 shows a first embodiment which is similar to the arrangement of FIG. 3 except that the impedance circuit P is formed of a parallel circuit CR of a resistance element R2 and capacitance element CC. Those parts of FIG. 4 corresponding to those of FIG. 3 are indicated by like references, and a detailed description will be omitted. This embodiment is adapted to produce the following effect: Assuming that the resistance of the resistance element R2 is $r_2$, that the capacitance of the capacitance element CC is $C_c$, and that the impedance of the parallel circuit CR is $Z'$, this impedance is given by $$Z'=\frac{1}{\frac{1}{r_2}+j\omega Cc}=\frac{r_2}{1+j\omega Ccr_2}=\frac{r_2-j\omega Ccr_2^2}{1+(\omega Ccr_2)^2} \quad (10)$$

If $C_c$ and $r_2$ is selected so as to meet the following relationship $$(\omega Ccr_2)^2 \quad 1 \quad (11)$$

then the impedance $Z'$ is given by $$z'=r_2-j\omega Ccr_2^2 \quad (12)$$

Thus, the impedance $Z_2$ between the terminals *t*1 and *t*2 becomes follows:

$$Z_2=-(\alpha_0-1)Z'+r_{ib1}$$
$$=-(\alpha_0-1)r_2+I\omega(\alpha_0-1)Ccr_2^2+r_{ib1} \quad (13)$$

If the following relationship is established $$|(\alpha_0-1)Z'|>>|r_{ib1}| \quad (14)$$

then $Z_2=(\alpha_o-1)Z'$ $$=-(\alpha_o-1)r_2+j\omega(\alpha_o-1)Ccr_2^2 \quad (15)$$

If $Cc$ and $r_2$ in equation (10) are so selected as to meet the following condition $$(\omega Ccr_2)^2>>1 \quad (11),$$

then the following equation holds;

$$Z'=1/j\omega Cc \quad (12)$$

Thus, the impedance $Z_2$ is given by $$Z_2=-(\alpha_0-1)Z'+r_{ib1}$$
$$=r_{ib1}-(\alpha_0-1)\frac{1}{j\omega Cc} \quad (13)$$

By establishing the following relationship $$|(\alpha_0-1)Z'|>>|r_{ib1}| \quad (14)$$

the impedance $Z_2$ becomes as follows:

$$Z_2=-(\alpha_0-1)Z:$$
$$=-\frac{(\alpha_0-1)}{j\omega C_c} \quad (15)'$$

It is to be particularly noted that this embodiment represents an impedance equal to the sum of a negative resistance $-(\alpha_0-1r_2$ and an impedance based on an inductance of $(\alpha_0-1)C_cr_2^2$. That is, although the parallel circuit CR of the resistance element R2 and capacitance element CC is connected to the equivalent base terminal of circuit U, an impedance based on the sum of a negative resistance corresponding to the resistance of the resistance element R2 multiplied by a negative factor of $-(\alpha_0-1)$ and an impedance based on an inductance corresponding to the product of the square of the resistance of the resistance element R2 and capacitance of the capacitance element multiplied by a positive factor of $(\alpha_0-1)$ is obtained. This means that in case it is desired to eliminate the effect of a residual resistance in a certain circuit in which an inductor is to be connected, this can be automatically achieved by connecting this circuit across the terminals *t1* and *t2* of FIG. 4. Furthermore, it is possible to construct an oscillator by connecting another capacitance element between the terminals *t1* and *t2* and a predetermined load between the equivalent collector terminal 3 of the circuit U and the terminal *t2*. Also, by connecting a resistance element having a resistance substantially equal to $(\alpha_0-1 r_2$ in series with the terminal *t1*, this embodiment is the equivalent of an inductor representing a pure inductance even though no inductance is used and the circuit is constructed from resistance and capacitance elements.

It is to be noted that this embodiment represents an impedance based on a negative capacitance of $$-\frac{C_c}{(\alpha_0-1)}$$

as seen from equation (15)'. That is, although the capacitance element is connected to the base of the circuit U, this embodiment represents an impedance based on a negative capacitance corresponding to the capacitance of the capacitance element multiplied by the reciprocal of a negative factor $-(\alpha_0-1)$. This means that in case it is desired to eliminate the effect of a residual impedance based on a residual capacitance present in a certain circuit, such residual impedance can be automatically cancelled or compensated for by utilizing the circuit shown in FIG. 4.

Figure 5:
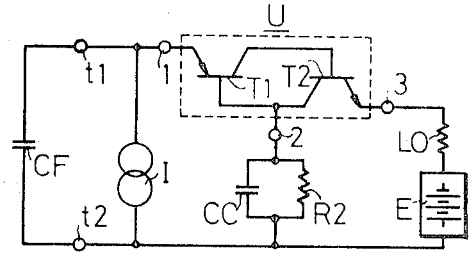
FIG. 5 is a connection diagram showing an example of the oscillator circuit using the transistor impedance converter according to the present invention.

Referring to FIG. 5 there is shown an example of the oscillator of the present invention which is constructed by the use of the impedance device described above in connection with FIG. 4. The embodiment shown in FIG. 5 is similar to the arrangement of FIG. 4 except that a load LO is connected between the terminals 3 and *t2* and a capacitance element CF is connected between the terminals *t1* and *t2*. Therefore, parts of FIG. 5 corresponding to those of FIG. 4 are indicated by like reference symbols and their description will be omitted. It is assumed that the impedance of the parallel circuit CR is $Z'$ as described above in connection with FIG. 4 and impedance $z'$ is given by equation (10). In this embodiment, the values $r_2$ and $C_c$ of the resistance element R2 and capacitance element CC are selected so as to meet equation (11) to obtain equation (12).

With the foregoing arrangement, the impedance between the terminals *t1* and *t2* is given by equation (13) in the case where the capacitance element CF is not connected between the terminals *t1* and *t2*. Further, equation (13) is changed to equation (15) by satisfying the relationship represented by equation (14). Therefore, the impedance between the terminals *t1* and *t2* is the sum of a negative resistance $-R'$ and an impedance based on an inductance which is given by $$L'=(\alpha_0-1)C_c r_2^2 \quad (16)$$

The absolute value of the negative resistance $-R'$ is given by $$R'=(\alpha_0-1)r_2+r_{ib1} \quad (17)$$

in the case where equation (13) is applied and by $$R'=(\alpha_0-1)r_2 \quad (17)'$$

in the case where equation (15) is applied.

The arrangement according to the present invention wherein the capacitance element CF is connected between the terminals *t1* and *t2* as shown in FIG 5 makes it possible to produce oscillation at a frequency $$1/2\pi\sqrt{L'\cdot C_f} \text{ or } 1/2\pi\sqrt{(\alpha_0-1)C_c r_2^2}$$

which depends upon the inductance $L'$ or $(\alpha_0-1)C_c r_2^2$ in equation (16) and the capacitance $C_f$ of the capacitance element CF. The oscillation output is available across the load LO.

The embodiment shown in FIG. 5 discloses an oscillator having a simplified arrangement. It is to be particularly noted here that although an inductor is usually required by a conventional oscillator, an inductor in the oscillator is not needed in the present invention. Thus, the oscillator circuit according to the present invention can be constructed in the form of an integrated circuit.

In an actual example of the circuit shown in FIG. 5, the transistors T1 and T2 were type 2SA210 and 2SC283 transistors, respectively; the capacitance $C_c$ of the capacitance element CC was 100 pf.; the resistance $r_2$ of the resistance element R2 was 1 KΩ; the load LO was a resistor of 100Ω; the voltage of the voltage source E was 6 v.; and the current source I was a circuit in which a resistor of 30 KΩ was connected in series with a DC power source. By supplying a current of 1 ma. to the terminal 1, there was obtained a sinusoidal oscillation output of 1.5 v. (peak-to-peak) at 1 MHz.

A description will be given of an example of the inductor embodying the present invention which is constructed by using the impedance device of FIG. 4 with reference to FIG. 6.

Figure 6:
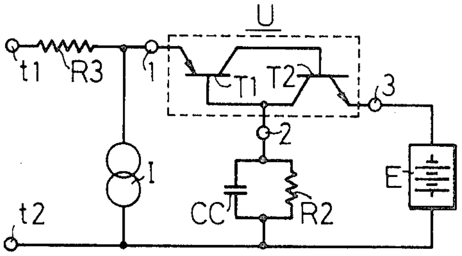
FIG. 6 is a connection diagram showing another example of the inductor using the transistor impedance converter according to the present invention.

The embodiment of FIG. 6 is similar to that of FIG. 4 except that a resistor R3 is inserted in the line between the terminals *t1* and 1. Therefore, parts of FIG. 6 corresponding to those of FIG. 4 are indicated by the same reference symbols and description will be omitted.

The impedance $Z'$ of the parallel circuit CR is given by the equation (10). In this embodiment, the values $r_2$ and $C_c$ of the resistance element R2 and capacitance element CC are selected so as to meet equation (11). Thus, equation (12) is obtained.

In the foregoing arrangement, the impedance between terminals *t1* and *t2* is given by equation (13) where the resistance element R3 is absent or is short circuited. Further, equation (13) is changed to equation (15) by establishing the relationship represented by equation (14).

Thus, with the arrangement of FIG. 6 wherein the resistance element R3 is connected between the terminals *t1* and *t2* and, satisfying the conditions of equations (11) and (14), the impedance between the terminals *t1* and *t2* is given by $$Z_2'=-(\alpha_0-1)r_2+j\omega(\alpha_0-1)C_c r_2^2+r_3 \quad (18)$$

where $r_3$ is the resistance value of the resistance element R3. Therefore, by selecting the resistance value $r_3$ to meet the following relationship $$r_3=|-(\alpha_0-1)r_2| \quad (19)$$

equation (18) can be rewritten as follows:

$$Z_2'=j\omega(\alpha_0-1)C_c r_2^2 \quad (20)$$

From the foregoing, it will be seen that the arrangement of FIG. 6 serves as an inductive circuit having a pure inductance between the terminals *t1* and *t2* which is represented by $$L''=(\alpha_0-1)C_c r_2^2 \quad (21)$$

The embodiment of FIG. 6, provides an inductor having a pure inductance but including only capacitive and resistive elements. Therefore, such inductor can be easily constructed in the from of an integrated circuit.

Figure 7:
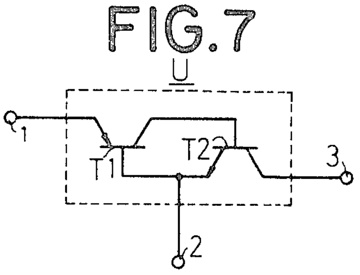
FIGS. 7 and 8 are connection diagrams showing other examples of the two-transistor circuit which can be utilized in the present invention, respectively.
Figure 8:
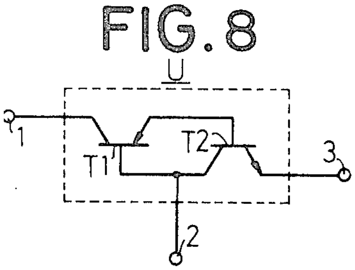

In the circuit U described in FIG. 1, the base of the PNP-transistor T1 is connected to the collector of the NPN-transistor T2, and the terminal 3 was led out of the emitter of the transistor T2. However, it is also possible that the base of the transistor T1 be connected to the emitter of the transistor T2 and that the terminal 3 be led out of the collector of the transistor T2, as shown in FIG. 7. Furthermore, it is also possible that the emitter of the transistor T1 be connected to the base of transistor T2 and that the terminal 1 be led out of the collector of the transistor T1, as shown in FIG. 8. With such arrangements equivalent common base current amplification factor$\alpha_0$ of the circuit U becomes greater than 1 as in the case of FIG. 1. A transistor generally has interchangeability between the emitter and the collector. In the arrangements of FIGS. 7 and 8, however, the equivalent common current amplification factor becomes smaller than in the case of FIG. 1. For example, when type 2SA355 and 2SC283 transistors are used for the transistors T1 and T2 respectively, $\alpha_0$ becomes about 2.5 in the case of FIG. 7 and about 20 in the case of FIG. 8. The transistors T1 and T2 have been described as being of the PNP- and NPN-types respectively. However, the conductivity types of these transistors may be reversed. That is, the transistors T1 and T2 may be of the NPN- and PNP-types respectively, and it is possible to produce the same effect as described above, by reversing the polarities of the voltage source and current source, as will be readily apparent to those skilled in the art.

Figure 9:
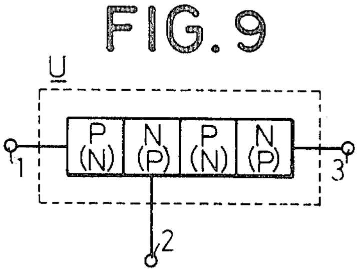
FIG. 9 is a schematic diagram showing a further example of the two-transistor circuit which can be utilized in the present invention.

The transistor circuit with an equivalent common base current amplification factor greater than 1 was constructed by the use of two transistors T1 and T2. For example, it is also possible to construct the transistor circuit by taking the equivalent emitter terminal 1 out of the first P- (or N-) type layer of a PNP (or NPNP type semiconductor device and the equivalent base terminal 2 out of the immediately adjacent N- (or P-) type layer and the equivalent collector terminal 3 out of the last N- (or P-) type layer as shown in FIG. 9.

Although the present invention has been illustrated and described with respect to particular examples, various modifications and changes will become possible without departing from the spirit and scope of the present invention. It is to be understood that such modifications and changes also constitute part of the present invention.

What is claimed is:

1. A transistorized circuit comprising
 a pair of transistors of opposite conductivity types,
 the base electrode of the first transistor connected to the collector of the second transistor,
 a collector of the first transistor connected to the base of the second transistor,
 a first resistor,
 a first capacitor connected in parallel with said first resistor and one side of the parallel combination connected to the base of said first transistor,
 a voltage source connected to the other side of said parallel combination and to the emitter of said second transistor, and
 a current source connected between the emitter of said first transistor and the other side of said parallel combination.

2. A transistorized circuit according to claim 1 comprising a second capacitor connected in parallel with said current source.

3. A transistorized circuit according to claim 2 comprising a second resistor connected between said voltage source and said emitter of said second transistor.

4. A transistorized circuit according to claim 2 comprising a pair of input terminals with one connected to the junction point between said voltage source and said parallel combination, and a second resistor connected between said second input terminal and said emitter of said first transistor.

5. A transistor impedance converter comprising a two-transistor circuit consisting of first and second transistors of opposite types of conductivity equivalent to a single transistor having a common base current amplification factor $\alpha_0$ greater than 1, an impedance circuit constituted of a parallel circuit of a resistance element having a resistance $r_2$ and a capacitance element having a capacitance $C_c$, one end of said impedance circuit being connected to the equivalent base terminal of said two-transistor circuit, a first external terminal connected to the equivalent emitter terminal of said two-transistor circuit, a second external terminal connected to the other end of said impedance circuit, and means for imparting an operating power source to said two-transistor circuit, said resistance $r_2$ and said capacitance $C_c$ being so selected as to meet a relationship of $(\omega C_c r_2)^2 << 1$, $\omega$ being an operational angular frequency, thereby obtaining an impedance substantially equal to the sum of a negative resistance $-(\alpha_0-1)\,r_2$ and an impedance based on an inductance $(\alpha_0-1)C_c r_2^2$ between said first and second terminals without using any inductor.

6. A transistor impedance converter comprising a two-transistor circuit consisting of first and second transistors of opposite types of conductivity equivalent to a single transistor having a common base current amplification factor $\alpha_0$ greater than 1, an impedance circuit constituted of a parallel circuit of a resistance element having a resistance $r_2$ and a capacitance element having a capacitance $C_c$, one end of said impedance circuit being connected with the equivalent base terminal of said two-transistor circuit, a first external terminal connected with the equivalent emitter terminal of said two-transistor circuit, a second external terminal connected with the other end of said impedance circuit, and means for imparting an operating power source to said two-transistor circuit, said resistance $r_2$ and said capacitance $C_c$ being so selected as to meet a relationship of $(\omega C_c r_2)^2 << 1$, $\omega$ being an operational angular frequency, thereby obtaining an impedance based on a negative capacitance $$-\frac{C_c}{(\alpha_0-1)}$$

between said first nd second terminals.

7. An oscillator circuit comprising the transistor impedance converter set forth in claim 6, and a capacitor having a capacitance $C_f$ connected between said first nd second external terminals, thereby producing oscillation at a frequency represented substantially by $$\frac{1}{2\pi\sqrt{(\alpha_0-1)C_c r_2^2 \cdot C_f}}$$

without using any inductor.

8. A transistor impedance converter comprising a two-transistor circuit consisting of first and second transistors of opposite types of conductivity equivalent to a single transistor having a common base current amplification factor $\alpha_0$ greater than 1, an impedance circuit comprising a parallel circuit of a resistance element having a resistance $r_2$ and a capacitance element having a capacitance $C_c$, one end of said impedance circuit being connected to the equivalent base terminal of said two-transistor circuit, a first external terminal connected with the equivalent emitter terminal of said two-transistor circuit, a second external terminal connected to the other end of said impedance circuit, means for imparting an operating power source to said two transistor circuit, and a resistor having a resistance $r_3$ inserted in the line between said first external terminal and said equivalent emitter terminal of said two-transistor circuit, said resistance $r_2$ and said capacitance $C_c$ being so selected as to meet a relationship of $(\omega C_c r_2)^2 << 1$, $\omega$ being an operational angular frequency, and said resistance $r_3$ of said resistor being so selected substantially as to meet a relationship of $r_3 = (\alpha_0-1)r_2$, thereby obtaining an impedance based on an inductance $(\alpha_0-1)C_c r_2^2$ between said first and second external terminals without using any inductor.

* * * * *